(12) United States Patent
Preu et al.

(10) Patent No.: US 6,982,218 B2
(45) Date of Patent: Jan. 3, 2006

(54) METHOD OF PRODUCING A SEMICONDUCTOR-METAL CONTACT THROUGH A DIELECTRIC LAYER

(75) Inventors: Ralf Preu, Freiburg (DE); Eric Schneiderlöchner, Freiburg (DE); Stefan Glunz, Freiburg (DE); Ralf Lüdeman, Freiburg (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 25 days.

(21) Appl. No.: 10/380,836

(22) PCT Filed: Aug. 30, 2001

(86) PCT No.: PCT/EP01/10029

§ 371 (c)(1),
(2), (4) Date: Jul. 30, 2003

(87) PCT Pub. No.: WO02/25742

PCT Pub. Date: Mar. 28, 2002

(65) Prior Publication Data

US 2004/0097062 A1 May 20, 2004

(30) Foreign Application Priority Data

Sep. 19, 2000 (DE) .......................................... 100 46 170

(51) Int. Cl.
*H01L 21/44* (2006.01)

(52) U.S. Cl. ........................................ 438/600; 438/688
(58) Field of Classification Search ................ 438/688, 438/600–601

See application file for complete search history.

(56) References Cited

U.S. PATENT DOCUMENTS 5,011,565 A 4/1991 Dube et al.
5,183,780 A 2/1993 Noguchi et al.

FOREIGN PATENT DOCUMENTS

| DE | 38 15 512 C2 | 11/1989 |
| EP | 0 251 523 | 1/1988 |
| WO | WO 00 01019 A | 1/2000 |
| WO | WO 00/22681 | 4/2000 |

OTHER PUBLICATIONS

J. E. Cotter et al: "Novel Processes for Simplified Buried Contact Solar Cells", Conference Record of the 28$^{th}$ IEEE Photovoltaic Specialists Conference, Sep. 15–22, 2000, pp. 303–306, XP002200820, Anchrage, Alaska.

F. Duerinckx et al: "Simple and Efficient Screen Printing Process for Multicrystalline Silicon Solar Cells Based on Firing Through Silicon Nitride", 14th European Photovoltaic Solar Energy Conference, vol. i, Jun. 30, 1997—Jul. 4, 1997, pp. 792–795, XP002200821, Barcelona, Spain.

R. Preu et al: "Laser Ablation—A New Low–cost Approach for Passivated Rear Contact Formation in Crystalline Silicon Solar Cell Technology", 16$^{th}$ European Photovoltaic Solar Energy Conference, vol. II, May 1–5, 2000, pp. 1181–1184, XP002200822, Glasgow, UK.

*Primary Examiner*—Thanh Nguyen

(57) ABSTRACT

A method of electrically contacting a semiconductor layer (13) coated with at least one dielectic layer (12) which is coated with a metal layer the metal layer (11) is applied on the dielectric layer (12) and the metal layer (11) is temporarily locally heated in a line, linear or dotted pattern by means of a source of radiation (9) in a controlled manner in such a way that a local molten mixture, is formed consisting exclusively of the metal layer (11), the dielectric layer (12) and the semiconductor layer (13) are located directly underneath the metal layer (11) and upon solidification, leads to an electrical contact between the semiconductor layer (13) and the metal layer (11).

16 Claims, 4 Drawing Sheets

METHOD OF PRODUCING A SEMICONDUCTOR-METAL CONTACT THROUGH A DIELECTRIC LAYER

BACKGROUND OF THE INVENTION

1. Field of the Invention

The present invention relates to b method of electrically contacting a semiconductor surface coated with at least one dielectric layer, which surface is to be electrically contacted, particularly for contacting a p-conductive basic layer of a solar cell coated with a dielectric passivation layer.

2. Description of the Prior Art

For reasons of competition already, the industrial manufacture of solar cells is governed by the approaches to produce solar cells with a maximum efficiency, that is with an electric current yield as high as possible from the energy flow arriving on the solar cell and to keep the manufacturing expenditure together with the manufacturing costs, which are closely linked up therewith, as low as possible.

For a better understanding of the measures to be taken into consideration for an optimized manufacture of solar cells, the following statements are presented.

Solar cells are devices converting light into electric energy. Usually they consist of a semiconductor material—solar cells are mostly manufactured from silicon—that has n-doped or p-doped semiconductor regions. The semiconductor regions are referred to as an emitter or as a base, respectively, in a manner known per se. The light incident on the solar cell serves to generate positive and negative charge carriers within the solar cell, which are separated in space from each other at the interface between the n-doped (emitter) and the p-doped (base) semiconductor regions, at the so-called pn-junction. Metal contacts may be used, which are connected to the emitter and the base, to carry off these charge carriers separated from each other.

In the simplest form, solar cells consist of base regions 2 and emitter regions 3 over the entire area, with the emitter 3 being located on the side that faces the light, that is the face side of the solar cell. For illustration, reference should be made here to FIG. 1 that shows a known solar cell.

For establishing the electric contact of the base 2, usually the rear side of the solar cell 1 is provided with a metal layer 4 over its entire area, onto which appropriate rear-side contact conductors 5, e.g. of AlAg, are applied. The emitter region 3 is contacted with a metal grid 6 with the objective being to lose as little light as possible by reflection on the metal contact for the solar cell, that is the metal grid 6 presents a finger structure so as to cover a minimum of solar cell surface. For an optimization of the power yield of the solar cell 1, an attempt is made to keep the optical losses caused by reflection at a minimum. This is achieved by the deposition of so-called anti-reflection coatings 7 (ARC) on the surface of the face side of the solar cell 1. The thickness of the layer of the anti-refection coatings 7 is so selected that in the energetically most important spectral range a destructive interference of the reflective light occurs. Anti-reflection materials used may be titanium dioxide, silicon nitride and silicon dioxide. As an alternative or additionally, it is possible to achieve a reduction of reflection by the production of a suitable surface texture by means of an etching or mechanical processing method, as is also evident from the solar cell illustrated in FIG. 2. Here, the emitter region as well as the anti-reflection layer 7 applied on the emitter are configured to present such a structure that the light incident on the structured surface of the solar cell displays an increased probability of coupling on the structures designed to have a pyramid-like shape. In the case of the solar cell according to FIG. 2, too, electric contact of the emitter 3 is established with a metal grid 6 being as fine as possible, whereof only a narrow contact finger is shown in FIG. 2. The anti-reflection coating 7 on the face side may also serve as passivation layer that ensures, on the one hand, a mechanical protection of the surface and, on the other hand, presents also intrinsic effects with respect to the reduction of superficial recombination processes that will be discussed in more details below.

When a solar cell is electrically contacted, it is necessary to distinguish between the face side and the rear side. While on the rear side of the solar cell the establishment of a contact is attempted, which provides a low contact and conducting resistance, it is additionally necessary on the face side to couple a maximum of light into the solar cell. For this reason, normally a comb structure is created on the face side, as is obvious from FIG. 1, in order to keep both the resistance losses and the shading losses small. Usually, contacts are used which cover the entire area or which are structured such as in a grid-like manner.

The surfaces of solar cells of high efficiency excel themselves not only by good electric contacts but additionally also by a low rate of superficial recombination, which means that the probability of minority charge carriers arriving on the surface of the solar cell and possibly recombining there so that they do not contribute to the production of energy is low, which would result in a substantial reduction of the efficiency.

This can be realized either by the effects that (a) only a few minority charge carriers arrive on the surface, or that (b) they recombine on the surface with a low probability only.

The method (a) can be realized by the provision that a high level of doping with foreign atoms is created in the region of the surface or that a dielectric layer is applied on the surface while invariable charges are integrated into the interface plane between the semiconductor and the dielectric layer. A high doping level is realized by doping the emitter on the face side with different levels whilst, as a supporting provision, a rear side field—a so-called "back surface field" may be integrated on the rear side.

A high doping level is however, always has the disadvantage that even though the probability of recombination can be reduced on the surfaces of the solar cell, the probability of recombination within the solar cell layer is increased. Charges may also be integrated, for instance, by a silicon nitride layer that serves particularly well as anti-reflection coating.

The method (b) can be realized by the provision that the superficial recombination states are reduced, for example, by saturation of silicon bonds that are broken up on the surface and are hence not completely saturated by a layer of silicon nitride or silicon dioxide, which, as described above, may be used on the face side also as anti-reflection coating. This passivation may be applied on both the face side and the rear side and constitutes one of the most important features of highly efficient solar cells.

Another feature of such highly efficient solar cells are narrow (<40 pm) and high face side contacts (>10 mm) presenting a low contact and conduction resistance. The surface contacts configured as grid fingers should cover the smallest solar cell area possible, which means that they must be configured in the narrowest form possible. Moreover, the grid fingers should present the lowest conduction resistance possible for carrying off the charge carriers separated in the solar cell, which means that their cross-section should be as large as possible.

The most important known techniques of metallization for the rear side contacts of a solar cell are as follows:

(A) Screen Printing Technique

An aluminium paste is printed through a screen over the entire area on the surface. Then, in a high-temperature step, a temperature of roughly 700 to 800° C. is maintained for roughly 10 to 30 seconds. This operation realizes a sound electrical contact whilst an aluminium silicon alloy—the "back surface field"—is formed. This is the process most commonly applied in industry for producing the rear side contacts.

(B) Vapour Deposition Over the Entire Area

The metal coating is applied by vapour deposition over the entire area.

(C) Photolithography and Vapour Deposition

First of all, a mostly passivating dielectric layer such as silicon dioxide is applied. The desired structure is then exposed down to the previously applied dielectric layer by exposure, development and washing of a photosensitive film, the so-called etching resist. This dielectric layer is then opened up to the silicon wafer in a subsequent etching operation. On the rear side of the solar cell, metallization is possible immediately after the layer has been opened and the photosensitive etching resist has been removed. Then the rear side contact may be applied over the entire area, for example by vapour deposition.

The known photolithographic process is suitable for the production of structure sizes down to less then 1 $\mu$m. Photolithography, however, is a comparatively expensive technique and is therefore not usually applied in the industrial field of solar cell manufacture. The majority of processes applied so far for the production of solar cells having an efficiency better than 20% include several photolithographic steps of process. The solar cell described above with reference to FIG. 2 can be produced with application of the two aforedescribed photolithographic steps.

(D) Photolithography, local high doping and vapour deposition One variant of this method is the application of a locally high doping level among the contacts, which improves, above all, the contact characteristics. The known realization of local high doping is achieved by diffusing a doping substance that is to be applied prior to diffusion and that must possibly be removed again subsequently. Finally, the contacts are established as described above in item (C).

With the application of these methods, the highest efficiency levels of roughly 24% have been realized, which have so far been achieved on silicon. However, the process sequence is extremely expensive and complex and is therefore left out of consideration for the manufacture of solar cells on an industrial scale.

(E) A method suitable for producing the face side contact of a solar cell in a manner partly resembling photolithography has been described in the U.S. Pat. No. 5,011,565 "Dotted Contact Solar Cell and Method of Making Same" by Dube et al. The patent describes a solar cell type and a method of its manufacture. The face side of the solar cell is provided there with a dielectric coating that is opened on dots disposed in lines by means of a laser, specifically a YAG laser. The dots are applied at a defined spacing. The formation of the contacts proper is then realized by the deposition of nickel and copper in a chemical bath. This operation bridges the distances between the dot contacts.

(F) A similar contacting method is described in the U.S. Pat. No. 4,626,613. There, troughs are formed through a passivating dielectric layer in the surface of the solar cell for contacting, which troughs are subsequently filled with a contact metal. The trough is created by mechanical structuring techniques or preferably by laser ablation. The method is used for contacting the cell face side on an industrial scale.

(G) The patent document PCT/AU99/00871 discloses a contacting method based on diffusion from a semiconductor layer, wherein a metal layer is contacted through an electrically insulating intermediate layer and a semiconductor layer of a low doping level with a second electrically conductive semiconductor layer presenting a high doping level, by means of the application of energy at an optional level, using a laser source. Due to the high light energy introduced, diffusion from the semiconductor layer commences, which is simple to contact in view of its high doping level and which can be accepted for the formation of the electrical contact in the sense of the embodiments described in that prior art reference. When this technique is applied, a semiconductor layer is contacted that is simple to contact in terms of process engineering, on account of its high doping level, however, the electrically insulating separating layer as well as an intermediate semiconductor layer that is not to be contacted suffers substantial damage at an unacceptable level, which is caused by the high energy supply required.

(H) A further similar method for contacting the rear side is known from the publication of "R. Preu, S. W. Glunz, S. Schaefer, R. Luedemann, W. Wettling, W. Pfieging, entitled "Laser Ablation —A New Low-Cost Approach for Passivated Rear Contact Formation in Crystalline Silicon Solar Cell Technology", Proceedings of the 16$^{th}$ European Photovoltaic Solar Energy Conference, Glasgow, UK 2000. There, the rear side of a solar cell is contacted by applying first a passivating dielectric coating over the entire area, which coating is subsequently locally opened by means of a laser with short pulses. Then, an aluminium layer is applied over the entire area. A sounds electrical contact is created by heating the wafer up to 400° C. or more.

(I) Furthermore, a method has become known wherein a dielectric coating is applied over the entire area and subsequently a paste is locally applied—for instance by means of a screen printing technique—which contains, inter alia, also etching components in addition to metal components. When the temperature is increased this etching process is launched or accelerated so that the dielectric coating is locally opened and that a sound electric contact may be formed between the metal-containing paste and the substrate.

The solar cells manufactured to date on an industrial scale with application of the technologies of screen printing of an aluminium paste over the entire area (A) as well as of vapour deposition over the entire area, which have been briefly outlined in the foregoing, present an efficiency that is definitely lower than the efficiency of solar cells manufactured by application of the photolithography technology. A higher efficiency ratio means, however, a distinctly increased value of the solar cell. The application of the technologies (C) and (D) based on the techniques of photolithography is, however, so expensive and complex at present that it is not realized, despite the high efficiency ratios achievable.

According to the methods described in the U.S. Pat. Nos. 5,011,565 and 4,626,613 the silicon present underneath is so substantially damaged during removal of the dielectric coating that in practical operation one part of the silicon material must be removed with an additional etching step.

Moreover, in laser ablation, frequently the problem arises that the material ablated by the laser beam deposits on the surface to be processed and deposits on optical imaging units such as collecting lenses, which are possibly present in the light beam path, which involves a substantial negative influence on the removal process, interruptions of the removal process are the consequence for permitting necessary cleaning work.

Similar problems relating to cleaning occur in the method (G): In that case, however, the damage created by fusion of the entire region disposed underneath the field of laser effect, specifically in the dielectric coating, renders this method unsuitable for the application of highly efficient solar cell concepts. Moreover, the known method is merely one possibility of contacting highly doped semiconductor layers.

Finally, in the laser ablation method (H), the contact requires subsequent processing at temperatures higher than 300° C. after application of the metal coating, in order to achieve very good resistance values, which means an additional step in the process that restricts moreover the selection of the dielectric passivation layers.

The local application of the metal-containing paste containing also etching substances in correspondence with method (I) involves the disadvantage that the production of the paste is complicated and expensive and hence causes distinctly higher costs than the use of a pure metal that may be used, for instance, in vapour deposition. Apart therefrom, the surface must be cleaned prior to metallization. Moreover, in the contact forming process, the entire area of the rear side is exposed to high temperatures, which restricts the selection of possible passivation materials or which may result in an impairment of the passivation layer. Furthermore, when the rear side is only locally metallized, for example, in the form of a grid, the reflectivity of the rear side is reduced for an increase of the light capture inside the cell, compared against metallization of the entire area. For this reason, the reflection of light of a wavelength absorbed only slightly in the photovoltaic active material is substantially worse than in the case of a rear side metallized over the entire area.

DESCRIPTION OF THE INVENTION

The present invention is therefore based on the problem of improving a method of electrically contacting a surface to be electrically contacted and coated with at least one dielectric layer, particularly for contacting the base layer of a solar cell, which is coated with a dielectric passivation layer, in such a way that the disadvantages occurring in prior art and set out in the foregoing may be circumvented. In particular, the manufacture of efficient solar cells at an industrial scale should be possible, which satisfies, on the one hand, the high demands for the achievement of high efficiency ratios, and, on the other hand, favors production of solar cells at the most expedient price possible. Overheating of the material regions not to be contacted, damage to the semiconductor material to be contacted or to the dielectric coating surrounding the contact area, as well as contamination during the contact forming operation should be avoided completely. Moreover, it is an objective to avoid, under all circumstances, the diffusion of doping atoms from the possibly joining of doped semiconductor layers, for example, from the solar cell emitter into the base material to be contacted or vice versa, which normally occurs as a result of excessive energy introduced into the semiconductor layer.

In accordance with the present invention, the method of electrically contacting a semiconductor layer to be electrically contacted and coated with at least one passivating dielectric coating—specifically for contacting the base layer of a solar cell configured by a pn junction, which is coated with a dielectric passivation layer—is so improved that the entire area of the passivation layer is coated with a metal layer—preferably an aluminium layer—and that the contact is established by temporary local fusion of the metal layer, the dielectric coating and of the semiconductor layer only by means of a source of radiation. Due to the locally narrowly defined process of fusion of the aluminium coating and of the dielectric layer located between the aluminium layer and the semiconductor layer, as well as of the surface of the semiconductor layer, a local molten mixture is formed between the individual layers that, after solidifcation, forms an electrical contact between the semiconductor and the metal layer. Here, the stratified combination is modified only directly on the site of the contact in such a way that in this manner a sufficiently low contact resistivity can be obtained between the metal layer and the doped semiconductor layer for the manufacture of highly efficient solar cells. In particular, it is hence decisive that the amount of energy introduced is so controlled that a sufficiently low contact resistivity is achieved at the local contact, whilst attention should be paid to the fact that in the vicinity of the local contact, any influence on the characteristics of the stratified combination, particularly the passivation effect of the dielectric layer should be avoided as far as possible and that diffusion from the joining semiconductor layers will not occur.

The invention is based on a defined pattern or a defined array of contact sites being created through the passivation layer, which presents a thickness of less than 1 $\mu$m and preferably a thickness in the range from 10 nm to 500 nm, at which sites the material surface to be contacted, preferably the emitter and/or base layer of the solar cell, which is bonded to the metal layer, preferably of aluminium, in an electrically conducting manner, without modification of possibly joining layers. The metal layer presents a thickness of roughly 2 $\mu$m. The local heating of the aluminium and the passivation layers as well as of the semiconductor surface is preferably carried out by laser radiation, that is with an immediate influence of the laser light onto the surface of the aluminium, the latter is locally so greatly heated that a molten mixture of aluminium, the dielectric coating and the surface of the silicon material therebelow occurs, which is to be contacted and of the semiconductor layer is preferably made, is formed without the effect that the heat introduce into the semiconductor material to be contacted will become so substantial that diffusion of doping substance, from a following sermiconductor layer, for instance the emitter of the solar cell, may commence or that the passivation effect of the dielectric layer is reduced. In accordance with the invention, hence a three-dimensionally very narrowly restricted contact region is formed that does not present any further extension into the depth of the semiconductor region, except the extension for electrical contacting between the metal layer and the semiconductor layer, which are separated from each other by the dielectric layer. A prerequisite for this effect is the fact that the semiconductor surface present underneath the passivation layer is fused by the energy introduced to the smallest extent possible, whilst, at the same time, a low contact depth of a few micrometers (>20 pm) is achieved.

As has been mentioned before, preferably a laser is used as light source, which is preferably operated in a pulsed mode and which irradiates the contact sites also in multiple steps with suitable energy densities. Light pulses having a pulse length between one and 500 nano seconds are particularly well suitable in order to keep the thermal load on the material layers joining the contact region as low as possible, thus preserving their characteristics, particularly the passivation effect of the dielectric layer, whilst, however, at the same time, the thermal influence is maintained for a sufficiently long time or repeated for a sufficient number of times in order to ensure the fusion of the surface of the silicon so as to permit the creation of a very good electric contact. The local solidification of the molten mixture may take place in such a manner that first a layer of silicon doped with aluminium is formed on the surface of the semiconductor to be contacted and that the aluminium contact proper is then created thereon. The local doping presents the advantage that the contact resistivity is reduced and that the electric field generated by the doping materials reduces the recombination rate on the metal/silicon interface.

BRIEF DESCRIPTION OF THE DRAWINGS

The present invention will be described in the following, without any limitation of the general inventive idea, by exemplary embodiments, with reference to the drawing wherein.

DETAILED DESCRIPTION OF THE INVENTION

Figure 1:
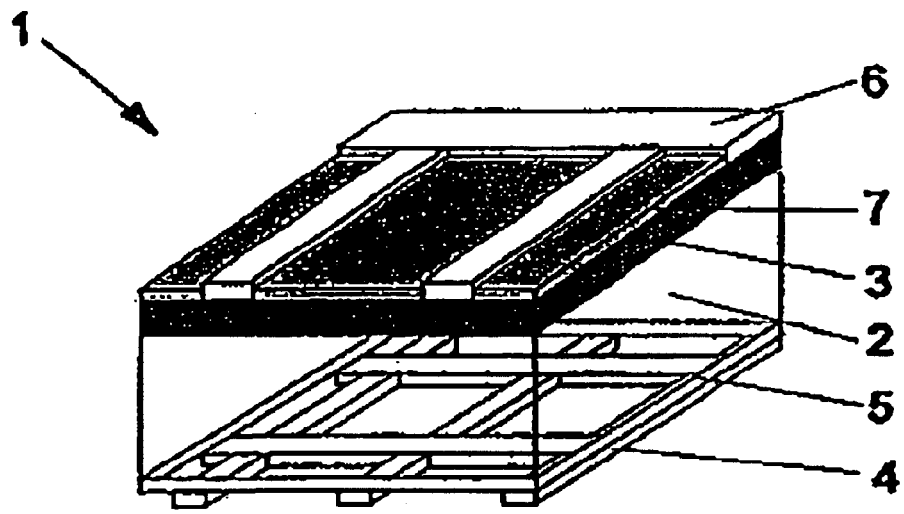
FIG. 1 shows a solar cell according to prior art.
Figure 2:
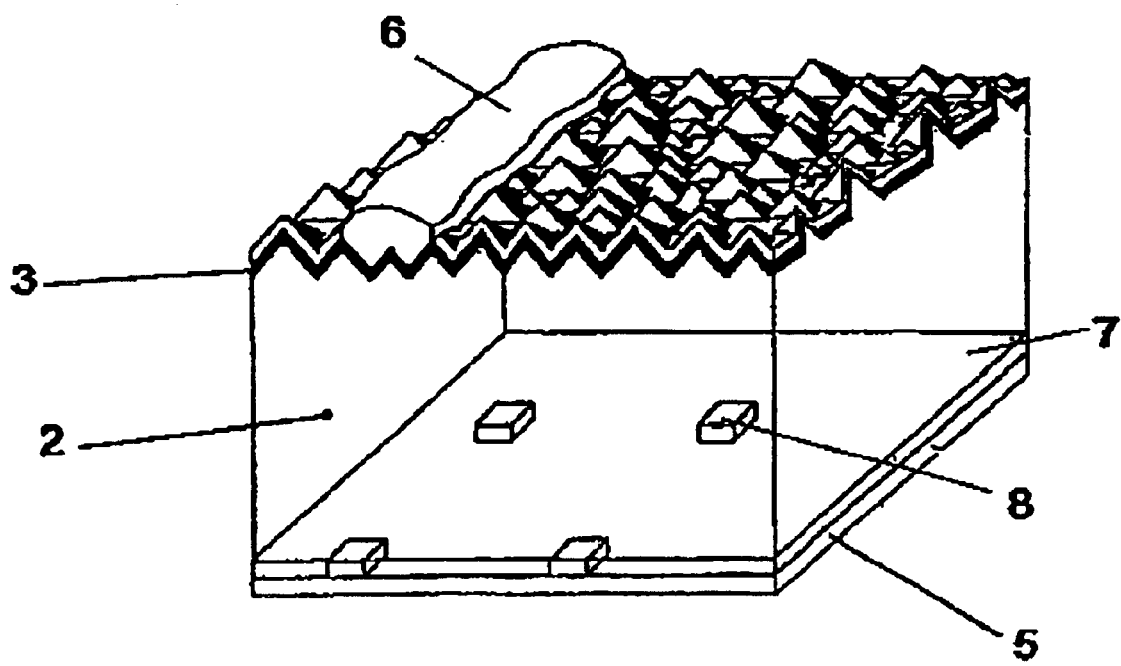
FIG. 2 is a view of an optimized solar cell with passivation layer according to prior art.

FIGS. 1 and 2 each show a known solar cell that is described in the introduction to the present description as the prior art. In particular, the solar cell illustrated in FIG. 2, which provides for a passivation layer on the rear side as well as for intrinsic effects for avoidance of superficial recombination of charge carriers for reasons of optimization, should preferably be manufactured by the inventive method at the lowest cost possible in a reliable manner. The passivation layer 7 plays a central role in the embodiments because it constitutes an essential characteristic of the solar cell type considered here, and because its function, that is the reduction of the superficial recombination and hence the increase of the number of charge carriers contributing to a flow of current, should not be impaired substantially by the contacting process.

Upon completion of the face side of the solar cell, first a thin passivation layer of silicon-enriched silicon nitride is applied with a typical thickness of roughly 60 nm. With reference to FIG. 2, this is the layer 7 that serves as passivation layer. The silicon nitride is subsequently condensed in a forming gas atmosphere at roughly 400° C. in order to improve and to preserve the passivation characteristics.

In a next step, a metal layer of aluminium is applied over the entire surface in a typical thickness of 2 μm. Such a stratified structure is illustrated in the upper embodiment according to FIG. 3, which shows a partial cross-sectional view of a solar cell whose rear side is turned upwards, together with the Si semiconductor layer 13 on the face side, which already contains the emitter 3, and together with the passivation layer 12 disposed thereon, and finally an aluminium layer 11 provided on the passivation layer 12.

Figure 3:
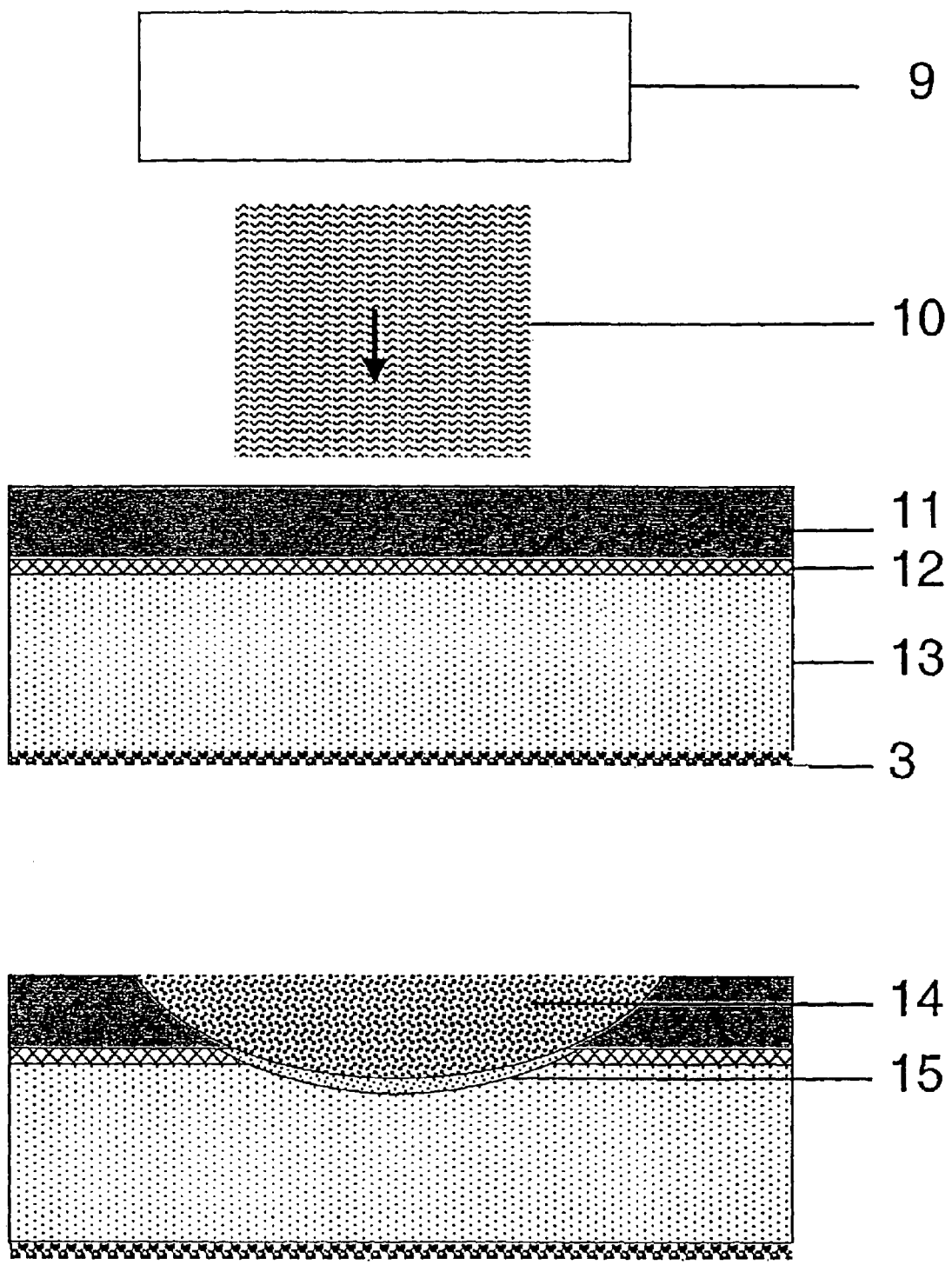
FIG. 3 illustrates the local fusion of the metal layer, the passivation layer therebelow and the surface of the silicon layer
Figure 4:
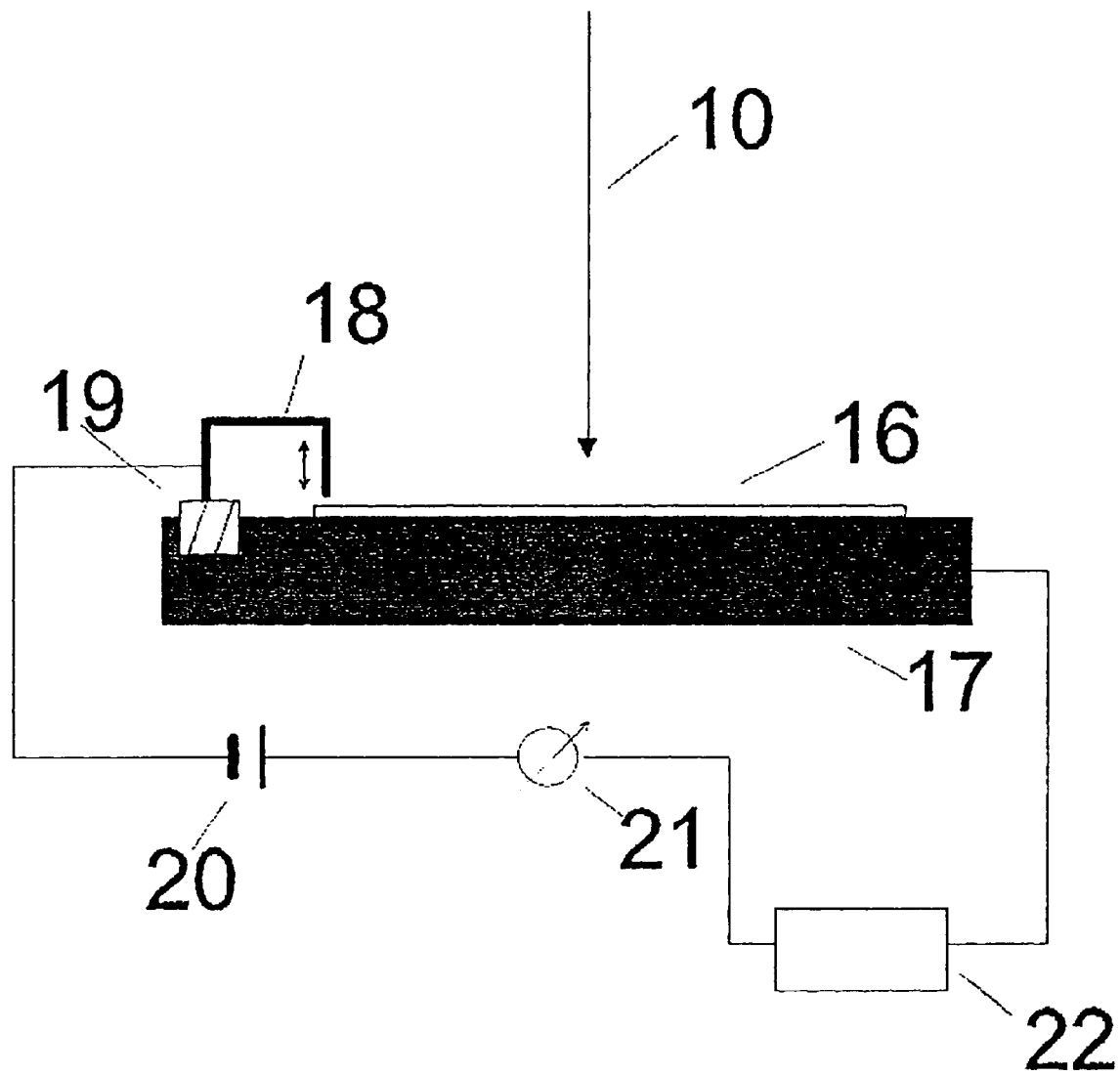
FIG. 4 shows a device for controlling the contacting process.

The solar cell with the rear side coated in this manner is then placed such that it rests on the measuring block 17 (shown in FIG. 4; discussed in more detail hereinbelow) by its face side, which supports the contact grid and is turned downwards, and is carried under the light source 9 schematically illustrated in FIG. 3, which is capable of generating dot-shaped light pulses 10 at short pulse lengths in the ns range.

Figure 5:
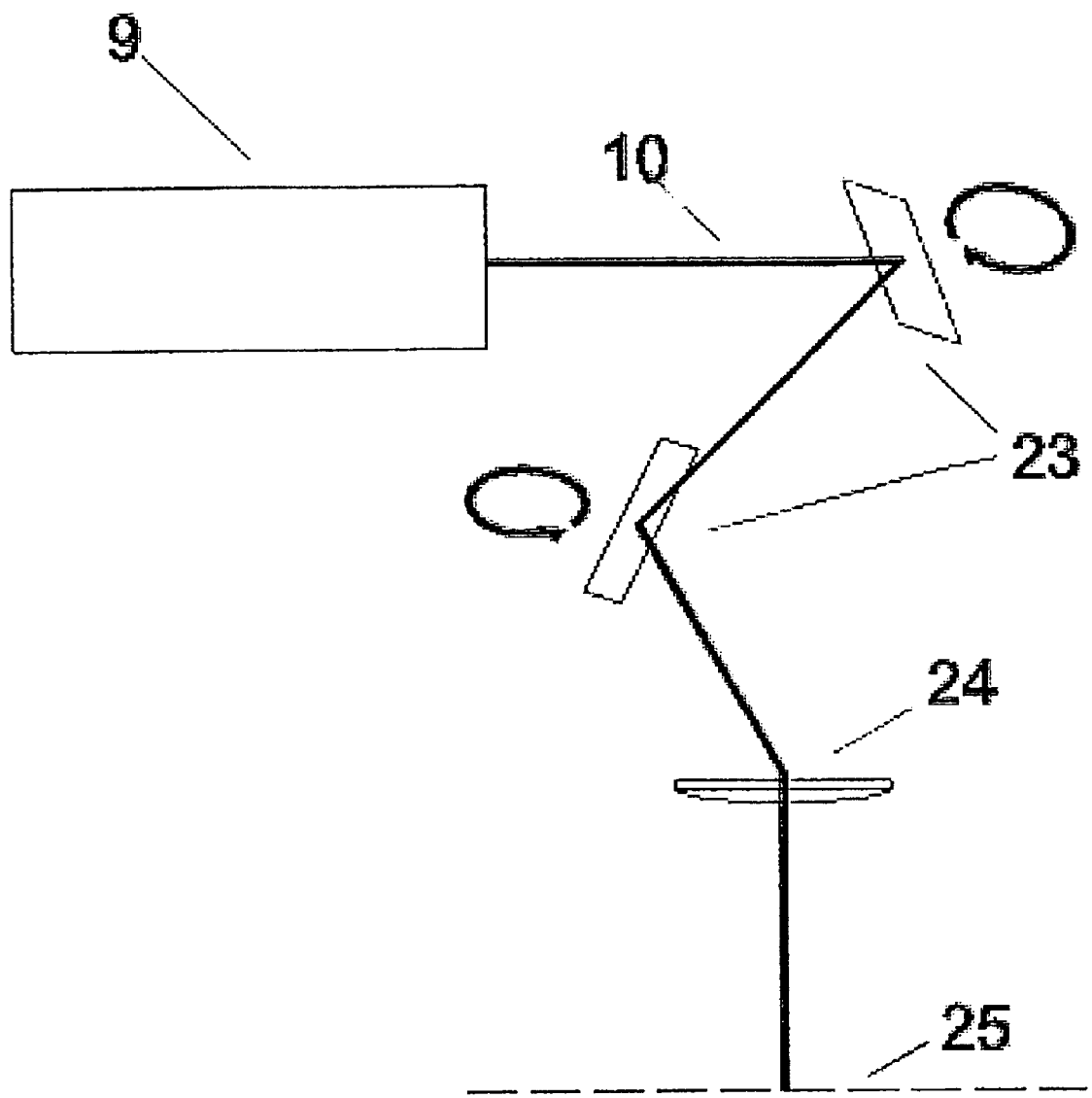
FIG. 5 is a view of a laser scanner for the industrial application of the contacting method according to the present invention.

The light source 9 is preferably integrated into a system with rotatable mirrors 23, which is shown in FIG. 5, with the mirrors positioning light pulses 10 in succession at short intervals through a focal lens 24 at a high rate at different sites on the rear side of the solar cell, which is located in the focal plane 25, in such a way that it becomes possible to process once all the contact sites distributed over the entire rear side within a few seconds. With a suitable selection of the laser parameters, a sufficiently good electrical contact is formed between the metal layer 11 and the semiconductor layer 13 after one or several repetitions of the process over all contact sites.

During the processing step, an electric circuit is closed between the rear side metal layer of the solar cell 16, the contact fingers 18, the voltage source 20, the current measuring equipment 21, the laser power controller 22, the measuring block 17 and the grid on the face side of the solar cell 16 via a contact finger 18 that is mobile in a direction orthogonal on the surface of the solar cell and that is electrically separated by an insulating envelope 19 from the measuring block. After the impression of a predetermined voltage by the voltage source 20 into the solar cell 16, through which initially no current flows on account of the non-conductivity of the dielectric layer 12 prior to the formation of the rear side contact through the aforedescribed stratified structure, the dot-shaped light source 10 begins to realize the aforedescribed contacting process. Only after a sufficiently good electric contact has been formed by the aforedescribed contacting method between the metal layer 11 and the semiconductor layer 13 through the dielectric layer 12, an electrical current predetermined by the imprinted voltage flows through the current measuring unit 21, whereupon the laser power controller 22 stops the contacting process. In this manner, it is possible to provide a defined energy introduction into the stratified structure to be processed, whilst the thermal load of the semiconductor surface to be contacted as well as of the dielectric layer in the vicinity of light application can be kept at a sufficiently low level.

It is yet possible to fuse the dielectric layer 12 as well as the surface of the Si semiconductor layer 13 by means of the light pulses 10 from the light source 9 for forming an electrical contact between the Si semiconductor layer 13 and the metal layer 11 in the region of direct influence of the light pulses 10 (compare FIG. 3, lower illustration). The control of the laser power by the measuring setup illustrated in FIG. 4 permits the precise low-damage process control and prevents an unintended diffusion out of the emitter 3 up to the rear side of the solar cell, which would come up to an electric short circuit and hence a destruction of the solar cell.

The aluminium 11I is applied by fusion in the manner of a metal bath in the aforedescribed manner with a precisely controlled laser power with a local application of light energy on the contact site 14, in such a controlled form that the process is terminated immediately after the formation of a sufficiently sound electrically conducting alloy 15 consisting of the forming a bath of molten aluminium. The surface of the silicon 13 is fused only over a depth of a few micrometers, as well as parts of the passivation layer 12.

In first tests of the solar cells manufactured in this way, a high efficiency of 19.3% was achieved with excellent contact characteristics. Processing without a precise control of the laser power turns out to be not readily reproducible and may result in an electrical short circuit between the base material to be contacted and the face side of the solar cell, which carries the emitter, either for the reason that the bath of molten aluminium is driven in too deep or on account of uncontrolled diffusion of doping atoms from the emitter layer 3 into the alloy 15 forming the contact.

Compared against prior art, the method hence entails several advantages: On the one hand, a layered structure may be employed which, at the present state of knowledge, permits a definitely higher efficiency of the solar cell than this would be possible with the techniques (A) and (B). Compared against the photolithographic techniques (C) and (D), the manufacturing process is definitely simpler and can be realized at lower costs.

Compared against the methods (E) to (H), the damage to the material can be reduced by the comparatively gentle alloying of the aluminium. Moreover, less energy is required for mere application by fusion than for removal or ablation so that with the same total energy employed, the processing time may be shortened. Apart therefrom, substantially more and, inter alia, more efficient layer systems are available for fusing a metal surface than for removal of dielectric layers. As the contact is formed already immediately upon fusion, it is possible to avoid soiling or contamination by ablated material of the environment of the local contact. Apart therefrom, the alloying of aluminium constitutes the possibility to achieve very good contact values and to reduce, at the same time, the recombination on the contact. Compared against the method (I), elemental metal may be used for contacting instead of the application of pastes with a complex formulation. In accordance with the present invention, the simple process operation involves also a high potential for lower-cost manufacture. The controlled and only local heating furnishes additional possibilities for using thermally sensitive materials whose passivation effect is reduced by an increase of the temperature, as is envisaged in method (I). Apart therefrom, the method (I) requires an additional process step for the realization of a rear side reflector.

In conclusion, the present invention hence permits a comparatively simple manufacturing method for the formation of a rear side contact, which presents a high efficiency potential and hence involves a distinct advantage over the variants so far known.

List of Reference Numerals
1 solar call
2 base region
3 emitter region
4 contact electrodes
5 rear side contact area
6 metal grid
7 anti-reflection coating, passivation layer
8 rear side contacts
9 light source, laser
10 laser pulse
11 metal surface
12 passivation layer
13 semiconductor
14 contact
15 alloy
16 solar cell
17 measuring block/mounting block
18 contact finger
19 insulator
20 voltage source
21 current measuring unit
22 laser power controller
23 rotatable mirrors
24 focussing lens
25 focal plane

What is claimed is:

1. A method of electrically contacting a semiconductor layer coated with at least one dielectric layer, comprising: applying a metal layer on the at least one dielectric layer and temporarily locally heating the metal layer in a line or at a plurality of sites in a linear pattern or a plurality of sites in a dotted pattern on the semiconductor layer by means of a controlled source of radiation providing radiation to produce a local molten mixture consisting exclusively of the metal layer, the dielectric layer and the semiconductor layer at the line or at the linear pattern or at the dotted pattern to provide an electrical contact with controlled contact electrical resistivity between the metal layer and the semiconductor layer with the dielectric layer and the semiconductor layer being located directly beneath the metal layer, which, upon solidification produces the electrical contact between the semiconductor layer and the metal layer of the controlled contact resistivity, and that both the surrounding dielectric layer and the semiconductor layer which are contacted are not changed by excessive heating during the local heating regarding the function thereof, beyond a region of the electrical contact.

2. A method according to claim 1, wherein a selective fusion of a surface of the semiconductor layer is produced by the radiation with restriction of damage caused by the radiation by controlling radiation power provided by the radiation source which exposes the dielectric layer and the semiconductor layer while minimizing thermal from the radiation.

3. A method according to claim 1, wherein a surface is contacted by combination of contacted points or lines.

4. A method according to claim 1, wherein contact resistivity is smaller than 0.02 $\Omega cm^2$ with the metal layer alloying into a surface of the semiconductor layer under the line or the linear pattern or the dotted pattern.

5. A method according to claim 1, wherein the metal layer and the semiconductor layer are separated from each other by only one dielectric layer.

6. A method according to claim 1, wherein at least one of silicon nitride and silicon dioxide is used as the dielectric layer.

7. A method according to claim 2, wherein the dielectric layer has a silicon fraction higher than a silicon fraction in a stoichiometric composition.

8. A method according to claim 1, wherein the dielectric layer has a thickness between 10 and 500 nm.

9. A method according to claim 1, wherein the metal layer consists of aluminum.

10. A method according to claim 1, wherein the metal layer is formed with a thickness between 0.5 and 10 $\mu$m.

11. A method according to claim 1, wherein the metal layer is produced by vapor deposition or sputtering.

12. A method according to claim 1, wherein the locally heated semiconductor layer has a local doping level with atoms from the metal layer, after solidification, which is of a same polarity as the semiconductor layer to be contacted and which, due to an electric field integrated therein, reduces a recombination rate at a semiconductor/alloy interface.

13. A method according to claim 1, wherein silicon is used as the semiconductor material.

14. A method according to claim 1, wherein p-doped silicon with a resistivity higher than 0.1 $\Omega cm^2$ is used as the semiconductor material.

15. A method according to claim 1, wherein the radiation source is a laser which produces a pulse length in a range from 1 ns to 500 ns.

16. A method according to claim 1, wherein the at least one dielectric layer is a passivation layer.

* * * * *